(12) United States Patent
Hossain et al.

(10) Patent No.: US 11,557,541 B2
(45) Date of Patent: Jan. 17, 2023

(54) INTERCONNECT ARCHITECTURE WITH SILICON INTERPOSER AND EMIB

(71) Applicant: Intel Corporation, Santa Clara, CA (US)

(72) Inventors: Md Altaf Hossain, Portland, OR (US); Ankireddy Nalamalpu, Portland, OR (US); Dheeraj Subbareddy, Portland, OR (US); Robert Sankman, Phoenix, AZ (US); Ravindranath V. Mahajan, Chandler, AZ (US); Debendra Mallik, Chandler, AZ (US); Ram S. Viswanath, Phoenix, AZ (US); Sandeep B. Sane, Chandler, AZ (US); Sriram Srinivasan, Chandler, AZ (US); Rajat Agarwal, Portland, OR (US); Aravind Dasu, Milpitas, CA (US); Scott Weber, Piedmont, CA (US); Ravi Gutala, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 873 days.

(21) Appl. No.: 16/235,879

(22) Filed: Dec. 28, 2018

(65) Prior Publication Data
US 2020/0211969 A1 Jul. 2, 2020

(51) Int. Cl.
*H01L 23/538* (2006.01)
*H01L 25/18* (2006.01)
(Continued)

(52) U.S. Cl.
CPC ...... *H01L 23/5385* (2013.01); *H01L 23/5386* (2013.01); *H01L 24/16* (2013.01);
(Continued)

(58) Field of Classification Search
CPC . H01L 23/5385; H01L 23/5386; H01L 24/16; H01L 24/17; H01L 25/18; H01L 23/481; H01L 2224/16146; H01L 2224/16225; H01L 2224/17181; H01L 2924/381; H01L 24/13; H01L 2224/16145; H01L 2224/16227; H01L 2224/1703; H01L 2224/17132; H01L 2224/17152; H01L 2225/06513; H01L 2225/06517; H01L 2225/06541; H01L 25/0657;
(Continued)

(56) References Cited

U.S. PATENT DOCUMENTS 8,941,233 B1 * 1/2015 Ngai ................ H01L 21/76898
257/706
9,337,111 B2 * 5/2016 Bintang ................ H01L 22/20
(Continued)

*Primary Examiner* — Mamadou L Diallo
(74) *Attorney, Agent, or Firm* — Schwabe, Williamson & Wyatt, P.C.

(57) ABSTRACT

Embodiments disclosed herein include electronic packages. In an embodiment, the electronic package comprises, a package substrate, an interposer on the package substrate, a first die cube and a second die cube on the interposer, wherein the interposer includes conductive traces for electrically coupling the first die cube to the second die cube, a die on the package substrate, and an embedded multi-die interconnect bridge (EMIB) in the package substrate, wherein the EMIB electrically couples the interposer to the die.

25 Claims, 7 Drawing Sheets

(51) Int. Cl.
*H01L 23/00* (2006.01)
*H01L 23/48* (2006.01)

(52) U.S. Cl.
CPC .............. *H01L 24/17* (2013.01); *H01L 25/18* (2013.01); *H01L 23/481* (2013.01); *H01L 2224/16146* (2013.01); *H01L 2224/16225* (2013.01); *H01L 2224/17181* (2013.01); *H01L 2924/381* (2013.01)

(58) Field of Classification Search
CPC .......... H01L 2225/06565; H05K 1/141; H05K 2201/10378; H05K 2201/10734
See application file for complete search history.

(56) References Cited

U.S. PATENT DOCUMENTS

| | | | | |
|---|---|---|---|---|
| 9,780,072 | B2* | 10/2017 | Jeng | H01L 21/4853 |
| 10,756,019 | B1* | 8/2020 | Wu | H01L 25/042 |
| 11,105,989 | B2* | 8/2021 | Lim | G02B 6/4231 |
| 11,164,817 | B2* | 11/2021 | Rubin | H01L 21/568 |
| 2007/0069391 | A1* | 3/2007 | Gritti | H01L 25/0657 |
| | | | | 257/777 |
| 2013/0214432 | A1* | 8/2013 | Wu | H01L 24/17 |
| | | | | 257/782 |
| 2015/0311185 | A1* | 10/2015 | Ng | H01L 24/85 |
| | | | | 257/784 |
| 2016/0111406 | A1* | 4/2016 | Mak | H01L 25/18 |
| | | | | 257/773 |
| 2017/0125383 | A1* | 5/2017 | Liu | G11C 8/12 |
| 2018/0174999 | A1* | 6/2018 | Modi | H01L 24/73 |
| 2018/0176006 | A1* | 6/2018 | McElheny | H01L 25/18 |
| 2019/0051642 | A1* | 2/2019 | Gupta Hyde | H01L 25/105 |
| 2019/0172787 | A1* | 6/2019 | Arguin | H01L 23/49894 |
| 2019/0204376 | A1* | 7/2019 | Goyal | G01R 31/2813 |
| 2019/0206791 | A1* | 7/2019 | Pietambaram | H01L 23/5386 |
| 2019/0326210 | A1* | 10/2019 | Teh | H01L 23/5382 |
| 2019/0393112 | A1* | 12/2019 | Nofen | H01L 23/293 |
| 2020/0035590 | A1* | 1/2020 | Tsai | H01L 23/49822 |
| 2020/0083179 | A1* | 3/2020 | Lee | H01L 23/49894 |
| 2020/0098724 | A1* | 3/2020 | Lift | H01L 23/36 |
| 2020/0105719 | A1* | 4/2020 | Li | H01L 24/19 |
| 2020/0111764 | A1* | 4/2020 | Kim | H01L 25/18 |
| 2020/0203309 | A1* | 6/2020 | Beyne | H01L 25/0657 |
| 2020/0402934 | A1* | 12/2020 | Kim | H01L 23/49822 |
| 2021/0165597 | A1* | 6/2021 | Lee | G11C 7/1066 |

* cited by examiner

INTERCONNECT ARCHITECTURE WITH SILICON INTERPOSER AND EMIB

TECHNICAL FIELD

Embodiments of the present disclosure relate to electronic packaging, and more particularly, to electronic packaging architectures that utilize silicon interposers and embedded multi-die interconnect bridges (EMIBs).

BACKGROUND

High performance computers (HPCs) typically use large CPU silicon chips with many cores to deliver high level computation, such as a high number of floating point operations per second (FLOPS). Overtime, CPU performance has significantly increased due to steady progress in silicon technology guided by Moore's Law. However, the CPU-DRAM bandwidth to deliver data to the CPU is limiting the performance of the HPC microprocessor. Therefore, various techniques are used to provide high bandwidth memory connection to the CPU. This includes placing multiple DRAM chips around the large CPU chip on the same package. This allows large numbers of short interconnections between the on-package DRAM and the CPU. The DRAM die may be in different configurations, e.g., single die or stacked-die configurations. Such a design with the CPU die and the memory die side-by-side on the same package significantly increases the memory bandwidth compared to off-package memory bandwidth. However, the need for even higher memory bandwidth and lower power leads to a package design that stacks the DRAM on top of the CPU by using through silicon vias (TSVs).

HPC CPU silicon generally uses the largest manufacturable die size, e.g., around 600-800 $mm^2$. Typical large DRAM die are around 100 $mm^2$ each. Accordingly, memory stacking on CPU requires stacking an array of about 6-8 DRAM die, placed side-by-side in an array form, over the large CPU die. However, such an architecture has several drawbacks. First, the yield of such a configuration is low, which leads to increased product cost. Particularly, a defect on any one of the many chips stacked on the CPU will render the product non-functional. Second, since there needs to be some physical spacing between the DRAM chips within the memory chip array (e.g., due to manufacturing process needs and DRAM die size variation) heat transfer from the CPU die to the heat spreader is not optimal.

EMBODIMENTS OF THE PRESENT DISCLOSURE

Described herein are electronic packages that utilize silicon interposers to couple die cubes together and embedded multi-die interconnect bridges (EMIBs). In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, current HPC architectures are not suitable for advanced processing nodes. Particularly, as the devices continue to scale to the 10 nm process node, existing solutions are no longer practicable. For example, the die sizes in the 10 nm node need to be reduced. Accordingly, the use of a large CPU die onto which an array of memory dies are stacked is not a manufacturable architecture for advanced process nodes. As such, embodiments disclosed herein include an interposer with high density routing for electrically coupling together an array of die cubes. In an embodiment, each die cube comprises a stack of dies. In a particular embodiment, the base die (i.e., the bottommost die) of each die cube may be a CPU die (e.g., field-programmable gate array (FPGA) dies) and one or more memory dies (e.g., DRAM dies) may be stacked over the CPU die. The interposer may then be electrically coupled to a package substrate.

While the process node for the CPU die may continue to be scaled, other die in the electronic package are still suitable for use in conjunction with the advanced node devices. For example, the transceiver die and high bandwidth memory (HBM) die from previous processing nodes can still be utilized. However, the such dies from previous generations may not be able to be integrated with such an interposer architecture. Accordingly, embodiments disclosed herein may further include an EMIB that electrically couples the additional dies to the interposer.

Figure 1A:
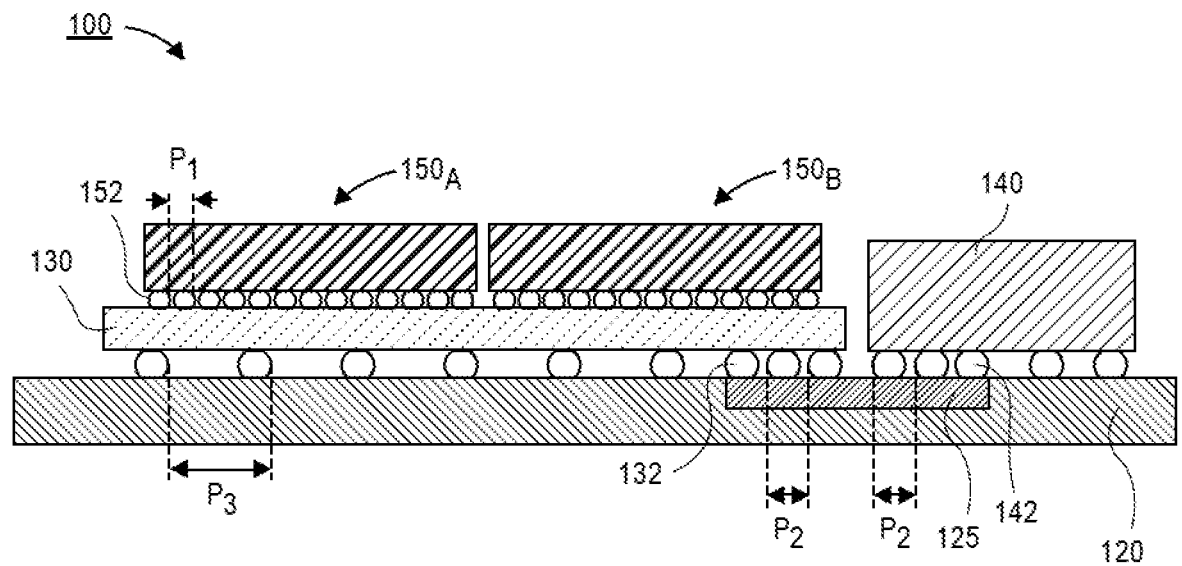
FIG. 1A is a cross-sectional illustration of an electronic package with a plurality of die cubes on an interposer and a die electrically coupled to the interposer by an embedded multi-die interconnect bridge (EMIB), in accordance with an embodiment.

Referring now to FIG. 1A, a cross-sectional illustration of an electronic package 100 is shown, in accordance with an embodiment. In an embodiment, the electronic package may comprise a package substrate 120. The package substrate 120 may be any suitable package substrate known in the art. For example, the package substrate 120 may comprise build-up layers and conductive routing (not shown). In an embodiment, the package substrate 120 may be a coreless package substrate or have a core.

In an embodiment, an interposer 130 may be electrically coupled to the package substrate 120. The interposer 130 may comprise any substrate material suitable for forming high density conductive traces (not shown). For example, the interposer 130 may be a silicon interposer. In some embodiments the interposer 130 may be a passive interposer. That is, the interposer 130 may comprise only passive structures, such as conductive traces, or the like. In other embodiments, the interposer 130 may be an active component. That is, the interposer 130 may include active structures, such as transistors or the like. In an embodiment, the interposer 130 may be electrically coupled to the package substrate 120 with interconnects 132. The interconnects 132 may be any suitable interconnect, such as solder bumps, or the like.

In an embodiment, a plurality of die cubes 150 may be coupled to the interposer 130. The die cubes 150 may comprise a stack of a plurality of interconnected dies. For example, the die cubes 150 may comprise a compute die (e.g., FPGA dies, etc.) and memory dies (e.g., DRAM dies, etc.). A more detailed description of the die cubes 150 is provided below with respect to FIGS. 1B and 1C. In an embodiment, the plurality die cubes 150 may be electrically coupled to the interposer 130 with interconnects 152, such as solder bumps or the like.

In an embodiment, the plurality of die cubes 150 may be electrically coupled together by high density conductive traces in the interposer 130. Accordingly, each of the die cubes 150 may function as a node in a computing fabric comprising the plurality of die cubes 150. Such a configuration allows for advanced process nodes (e.g., 10 nm) to be implemented on smaller sized dies in order to provide a more manufacturable system. Additionally, each of the die cubes 150 may be fully tested and burned in so that only known good die cubes 150 are integrated into the electronic package 100. As such, the yield of the electronic package is improved and cost of the package is reduced.

In an embodiment, peripheral dies (or die modules) 140 may also be included in the electronic package 100. For example, a peripheral die 140 is shown as being electrically coupled to the package substrate 120. In an embodiment, the peripheral die 140 may be electrically coupled to the package substrate 120 with interconnects 142, such as solder bumps. In an embodiment, the peripheral die 140 may be electrically coupled to the interposer 130 by an EMIB 125. The EMIB 125 may comprise a substrate material that is suitable for providing high density conductive traces in order to electrically couple devices. The EMIB 125 may be embedded in the package substrate 120.

The use of an EMIB 125 to electrically couple the peripheral die 140 to the interposer allows for peripheral dies 140 used in previous generations of electronic packages (e.g., electronic packages that comprise compute dies with larger process nodes) to be reused in advanced process node (e.g., 10 nm) electronic packages. For example, a transceiver die or a high bandwidth memory (HBM) die that is used in previous generation technology may be reused in electronic packages such as those described herein. Accordingly, design of the electronic package may be simplified and the speed to market may be increased.

In accordance with an embodiment, the interconnects 152, 142, 132 may have different pitches P. In an embodiment, the interconnects 152 that electrically couple the die cubes 150 to the interposer 130 may have a first pitch $P_1$. In an embodiment, each of the interconnects 152 may have a uniform pitch. In an embodiment, interconnects 142 may electrically couple the peripheral die 140 to the EMIB 125 and to the package substrate 120. In an embodiment, the interconnects 142 that electrically couple the peripheral die 140 to the EMIB 125 may have a second pitch $P_2$. In an embodiment, the second pitch $P_2$ may be larger than the first pitch $P_1$. In an embodiment, interconnects 132 may electrically couple the interposer 130 to the EMIB 125 and to the package substrate 120. In an embodiment, the interconnects 132 that electrically couple the interposer 130 to the EMIB 125 may have a second pitch $P_2$, and the interconnects 132 that electrically couple the interposer 130 to the package substrate 120 may have a third pitch $P_3$. In an embodiment, the third pitch $P_3$ is larger than the second pitch $P_2$.

Figure 1B:
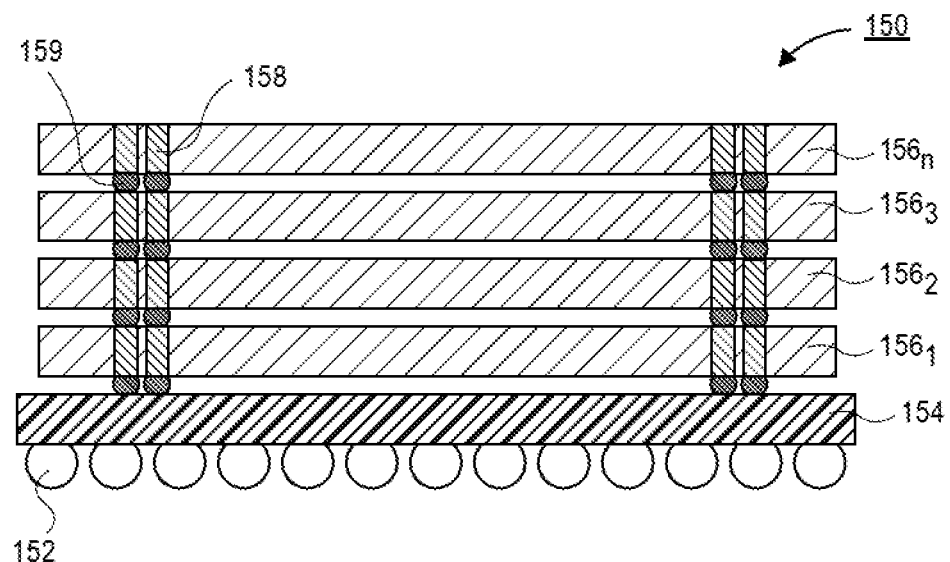
FIG. 1B is a cross-sectional illustration of a die cube comprising a base die and a plurality of memory dies stacked over the base die, in accordance with an embodiment.
Figure 1C:
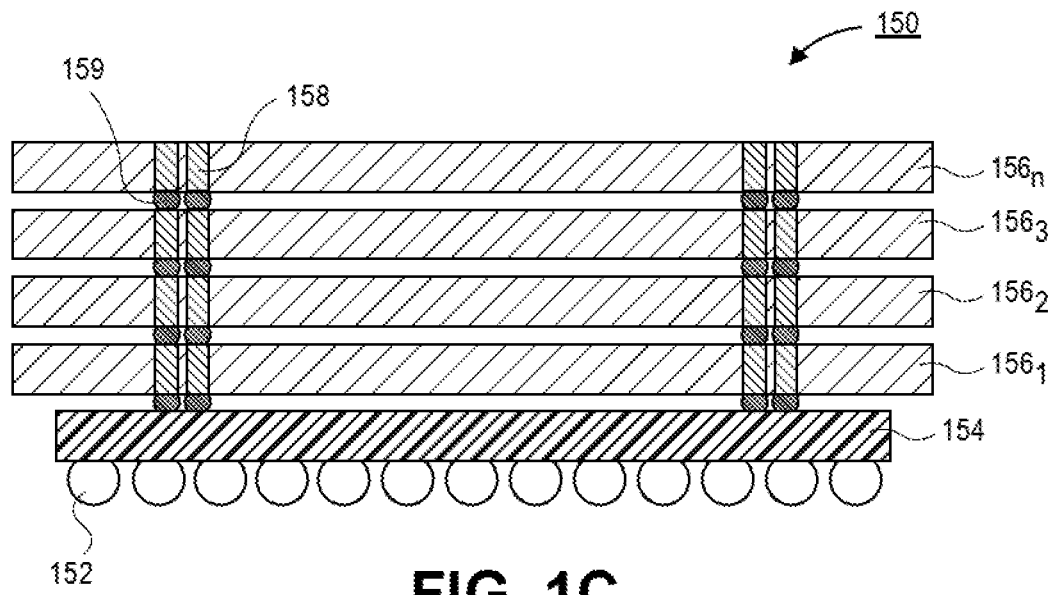
FIG. 1C is a cross-sectional illustration of a die cube comprising a base die and a plurality of memory dies stacked over the base die where a footprint of the memory dies is larger than a footprint of the base die, in accordance with an embodiment.

Referring now to FIGS. 1B and 1C, cross-sectional illustrations of die cubes 150 are shown, in accordance with various embodiments. In an embodiment, the die cube 150 may comprise a base die 154 and one or more stacked dies 156 over the base die 154. In the illustrated embodiment, four stacked dies $156_{1-n}$ are shown. However, it is to be appreciated that the any number of stacked dies 156 (e.g., one or more) may be stacked over the base die 154. While referred to herein as a die "cube", it is to be appreciated that the dimensions of the die cube 150 do not necessarily need to be cubic (i.e., having sides with equal lengths). As those skilled in the art will recognize, the dimensions of the die cube 150 may be variable depending on the number of stacked dies 156 and the desired footprint of the dies 154 and 156.

Furthermore, as shown in FIGS. 1B and 1C, the footprint of the base die 154 may be different than the footprint of the stacked dies 156. Particularly, in FIG. 1B the footprint of the base die 154 is shown as being larger than a footprint of the stacked dies 156. In other embodiments, such as the embodiment illustrated in FIG. 1C, a footprint of the base die 154 may be smaller than a footprint of the stacked dies 156. Such an embodiment may be particularly beneficial in providing improved thermal control of the base die 154. Since the entire surface of the base die 154 is covered, the entire surface of the base die 154 may be thermally coupled to a heat spreader (not shown) through the stacked dies 156. While FIGS. 1B and 1C illustrate a base die 154 with different footprints than the stacked dies 156, it is to be appreciated that in some embodiments the footprint of the base die 154 may be substantially the same as the footprint of the stacked dies 156.

In an embodiment, the stacked dies 156 may comprise through silicon vias (TSVs) 158 and be connected with bumps 159. TSVs 158 allow for the stacked dies 156 to be vertically stacked on top of each other. That is, the stacked dies 156 may be stacked without any offset that may otherwise be needed if other interconnect architectures (e.g., wire bonding) were used. In an embodiment, the stacked dies 156 may all be the same type of die. For example, the stacked dies 156 may be memory dies. In a particular embodiment, the stacked dies 156 may be DRAM dies.

In an embodiment, the base die 154 may be a compute die. For example, the base die may include integrated circuitry to form a CPU die. In a particular embodiment, the base die 154 may be a FPGA die. Embodiments disclosed herein may include a base die 154 that comprises transistor devices that are fabricated at an advanced process node. For example, the transistor devices of the base die may be processed at the 10 nm process node. In an embodiment, the base die 154 may also include TSVs in order to provide electrical connections between a top surface and a bottom surface of the base die 154 on which interconnects 152 are located.

Figure 2A:
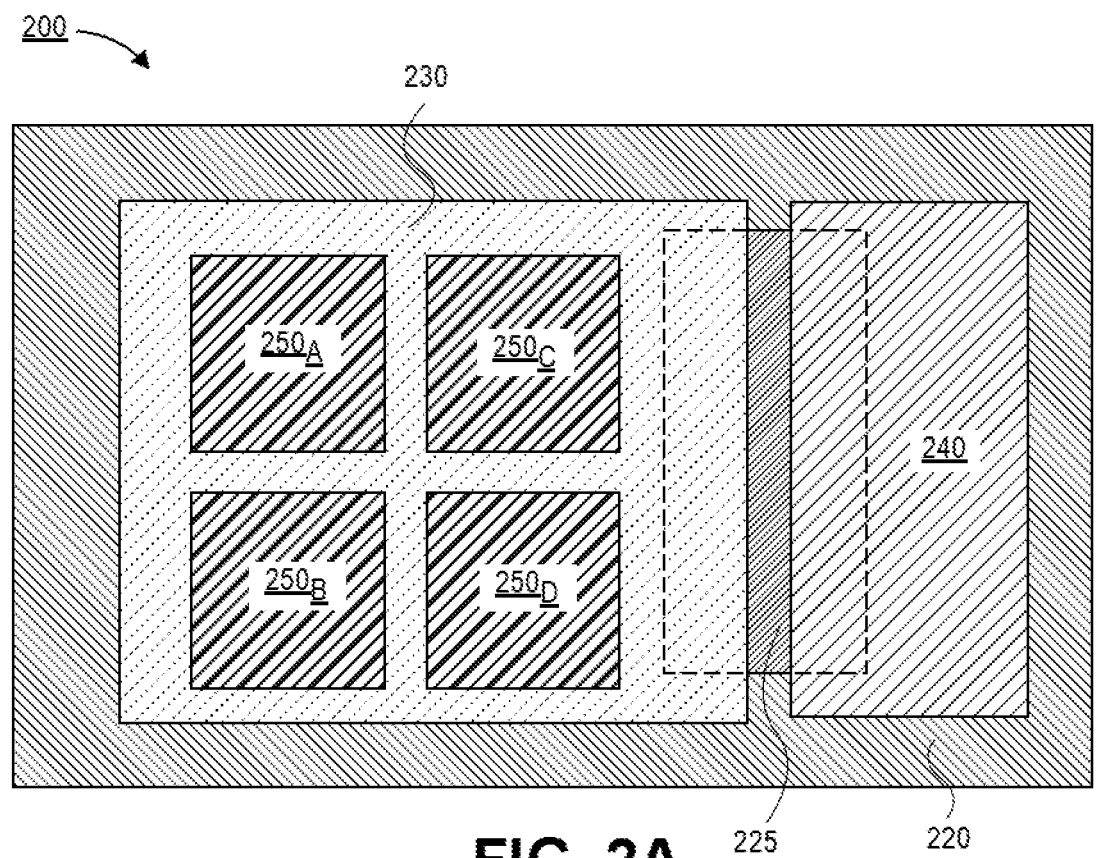
FIG. 2A is a plan view illustration of an electronic package with a 2×2 array of die cubes on an interposer and a die attached to the interposer by an EMIB, in accordance with an embodiment.

Referring now to FIG. 2A, a plan view illustration of an electronic package 200 is shown, in accordance with an embodiment. In an embodiment, the electronic package 200 may comprise a package substrate 220. An interposer 230 may be positioned over the package substrate 220. In an embodiment, the interposer 230 may be a silicon interposer. In an embodiment, the interposer 230 may be a passive interposer or an active interposer. In an embodiment, the interposer 230 may be substantially similar to the interposer 130 described above with respect to FIG. 1A.

As shown in FIG. 2A, an array of die cubes $250_{A-D}$ may be positioned over (and electrically coupled to) the interposer 230. In an embodiment, the die cubes $250_{A-D}$ may comprise a base die and one more stacked dies over the base die. The die cubes $250_{A-D}$ may be substantially similar to die cubes 150 described above with respect to FIGS. 1B and 1C. For example, the die cubes 150 may comprise a base die that is a FPGA die and the stacked dies over the base die may be DRAM dies. In an embodiment, the die cubes $250_{A-D}$ may comprise transistor devices fabricated at the 10 nm process node.

In the illustrated embodiment, the array of die cubes $250_{A-D}$ are arranged in a 2×2 pattern. The array of die cubes $250_{A-D}$ may be electrically coupled to each other through high density conductive traces (not shown) on the interposer 230. Accordingly, the array of die cubes $250_{A-D}$ may be considered to be a computing fabric, with each of the die cubes $250_{A-D}$ being a node in the computing fabric. In an embodiment, each of the die cubes $250_{A-D}$ are substantially similar to each other. That is, each of the die cubes $250_{A-D}$ may have the same base die and the same number of stacked dies over the base die. In other embodiments, each of the die cubes $250_{A-D}$ are not substantially similar to each other. That is, one or more of the die cubes $250_{A-D}$ may have a different base die, different numbers of stacked dies over the base die, or any other desired difference.

In an embodiment, the electronic package 200 may also comprise a peripheral die 240. The peripheral die 240 may be electrically coupled to the interposer 230 by an EMIB 225. In the illustrated embodiment, the EMIB 225 extends below surfaces of the interposed 230 and the peripheral die 240 (as indicated by the dashed lines). In an embodiment, the peripheral die 240 may be any suitable die needed for the electronic package 200. For example, the peripheral die 240 may be a transceiver or a HBM.

Figure 2B:
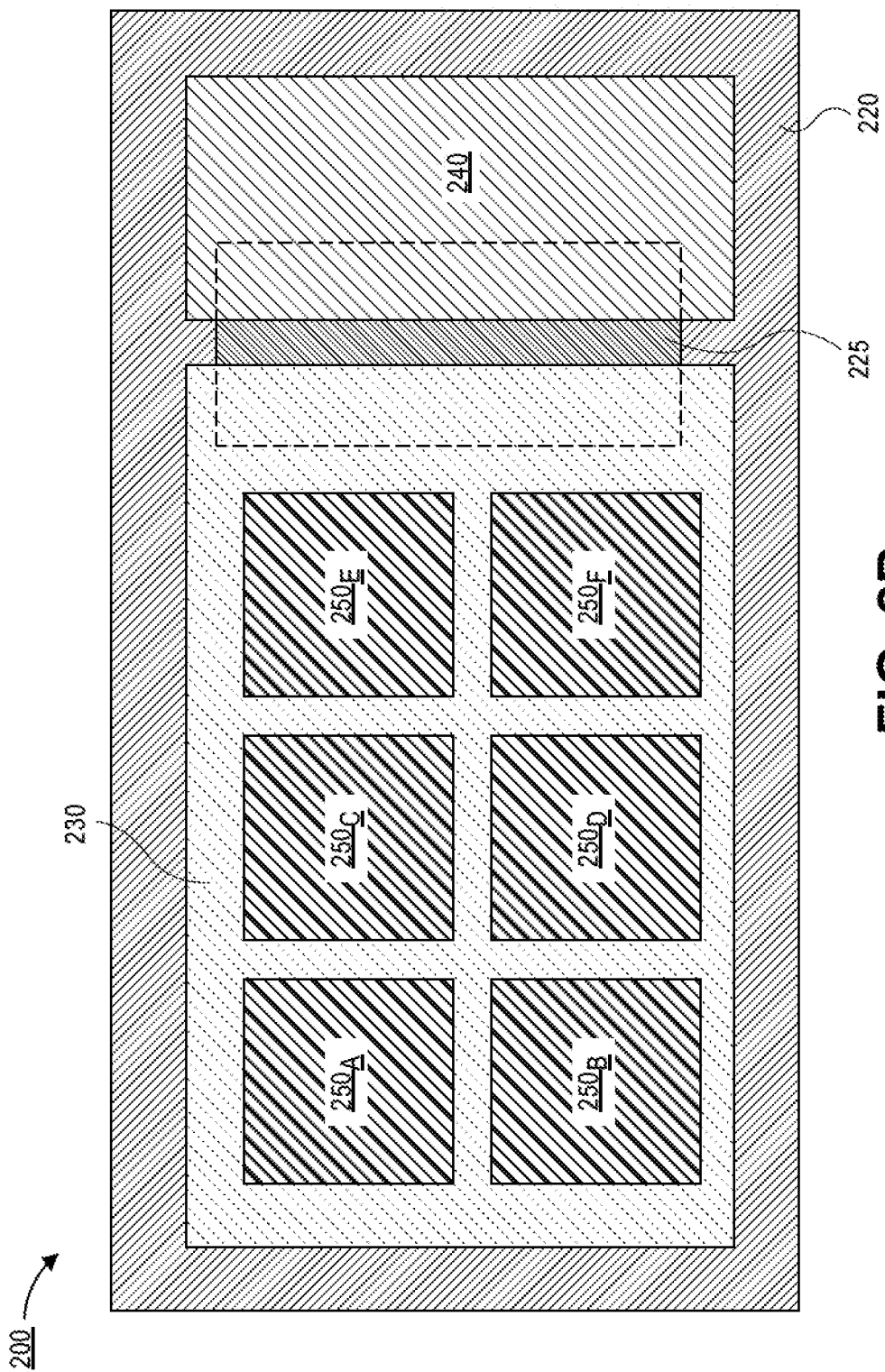
FIG. 2B is a plan view illustration of an electronic package with a 2×3 array of die cubes on an interposer and a die attached to the interposer by an EMIB, in accordance with an embodiment.

Referring now to FIG. 2B, a plan view illustration of an electronic package 200 is shown, in accordance with an additional embodiment. The electronic package 200 in FIG. 2B may be substantially similar to the electronic package 200 in FIG. 2A, with the exception that there are more die cubes 250 over the interposer 230. Particularly, FIG. 2B illustrates an array of die cubes 250 that form a 2×3 array. The addition of more die cubes 250 to the interposer allows for various line items for the product to be designed out using the same or similar die cubes 250 in different arrays. While a 2×2 array is shown in FIG. 2A and a 2×3 array is shown in FIG. 2B, it is to be appreciated that any array of die cubes 250 may be used. In a particular embodiment, the die cubes 250 may be arranged in a 2×N array, where N is equal to 1, 2, 3, etc. In other embodiments the array of die cubes 250 may be a M×N array where M is equal to 1, 2, 3, etc. and N is equal to 1, 2, 3, etc.

Figure 3:
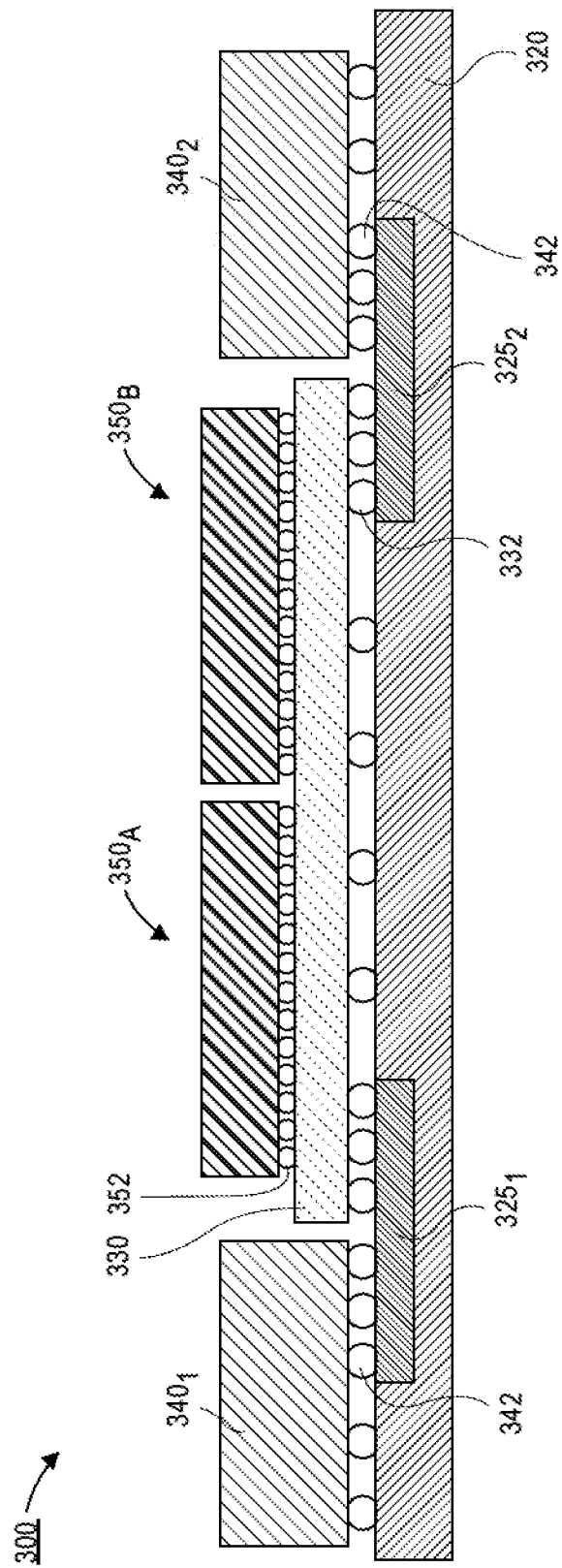
FIG. 3 is a cross-sectional illustration of an electronic package with an interposer, a plurality of die cubes on the interposer, and a plurality of dies attached to the interposer by EMIBs, in accordance with an embodiment.

Referring now to FIG. 3, a cross-sectional illustration of an electronic package 300 is shown, in accordance with an embodiment. The electronic package 300 may be substantially similar to the electronic package 100 described above with respect to FIG. 1A, with the exception that an additional peripheral die 340 is included. Particularly, the electronic package 300 may comprise a package substrate 320 and an interposer 330 coupled to the package substrate 320 with interconnects 332. A plurality of die cubes 350A and 350E may be electrically coupled to the interposer 330 with interconnects 352. While two die cubes 350A and 350E are shown, embodiments may include any number of die cubes 350 on the interposer 330.

In an embodiment, a first peripheral die $340_1$ may be over the package substrate 320. In an embodiment, the first peripheral die $340_1$ may be electrically coupled to the package substrate 320 with interconnects 342. In an embodiment, interconnects 342 may also electrically couple the first peripheral die $340_1$ to a first EMIB $325_1$. The first EMIB $325_1$ may electrically couple the first peripheral die $340_1$ to the interposer 330. Similarly, a second peripheral die $340_2$ may be over the package substrate 320. In an embodiment, the second peripheral die $340_2$ may be electrically coupled to a second EMIB $325_2$ with interconnects 342. The second EMIB $325_2$ may electrically couple the second peripheral to the interposer 330. In an embodiment, the first peripheral die $340_1$ may be a transceiver and the second peripheral die $340_2$ may be a HBM.

Figure 4A:
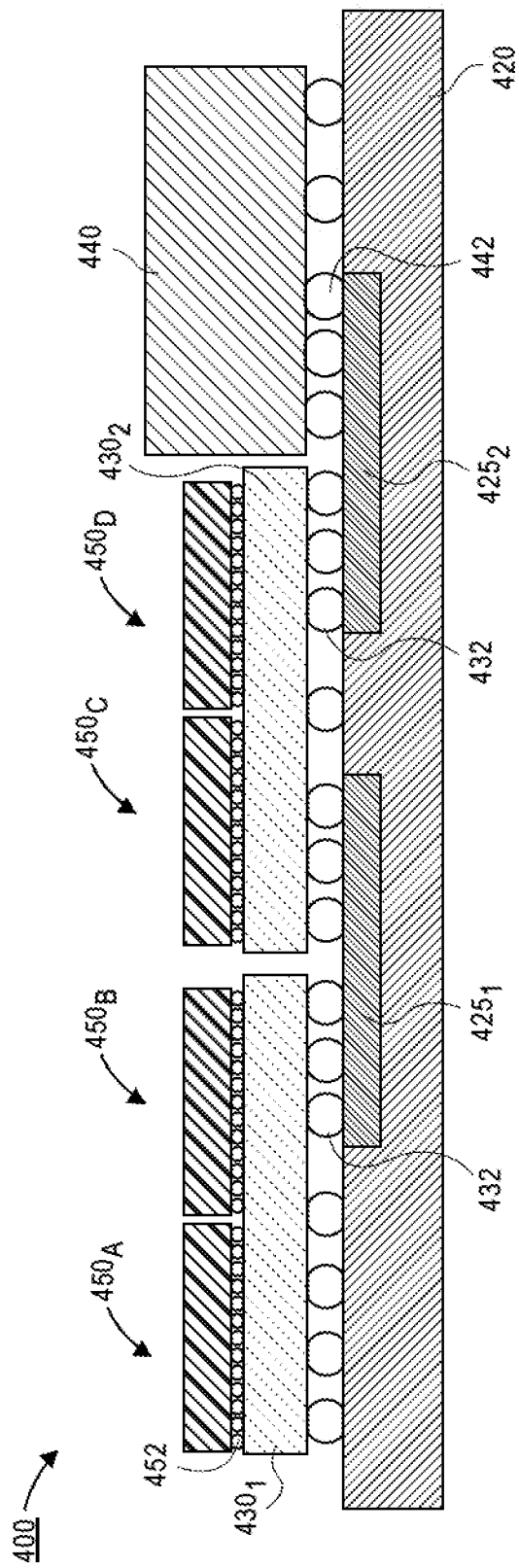
FIG. 4A is a cross-sectional illustration of an electronic package with a first interposer electrically coupled to a second interposer by a first EMIB and a die coupled to the second interposer by a second EMIB, in accordance with an embodiment.

Referring now to FIG. 4A, a cross-sectional illustration of an electronic package 400 is shown, in accordance with an embodiment. In an embodiment, electronic package 400 may be substantially similar to electronic package 100 shown in FIG. 1A, with the exception that a second interposer $430_2$ is included and electrically coupled to the first interposer $430_1$ by a first EMIB $425_1$.

Particularly, the electronic package 400 may comprise a package substrate 420. In an embodiment, a first interposer $430_1$ and a second interposer $430_2$ may be coupled to the package substrate 420 with interconnects 432. A plurality of die cubes $450_A$ and $450_B$ may be electrically coupled to the first interposer $430_1$ with interconnects 452, and a plurality of die cubes $450_C$ and $450_D$ may be electrically coupled to the second interposer $430_2$ with interconnects 452. While two die cubes $450_A$ and $450_B$ (or $450_C$ and $450_D$) are shown on each interposer 430, embodiments may include any number of die cubes 450 on each interposer 430. In an embodiment, each interposer 430 may include the same number of die cubes 450, or each interposer 430 may include different number of die cubes 450.

In an embodiment, the first interposer $430i$ may be electrically coupled to the second interposer $430_2$ with interconnects 432 that are attached to a first EMIB $425_1$. The use of EMIBs 425 to stitch interposers 430 together allows for larger computing fabrics to be manufactured. While two interposers $430i$ and $430_2$ are shown, any number of interposers 430 may be interconnected with EMIBs 425 in the electronic package 400. Additionally, the yield of the electronic package 400 may be improved since each subassembly of die cubes 450 and interposer 430 may be tested before integration into the electronic package 400 in order to use only known good devices.

In an embodiment, the electronic package 400 may also comprise a peripheral die 440. In an embodiment, the peripheral die 440 may be electrically coupled to one of the interposers 430 with a second EMIB 425$_2$. The peripheral die 440 may be electrically coupled to the EMIB 425$_2$ and the package substrate 420 with interconnects 442. The peripheral die 440 may be substantially similar to the peripheral die 140 described above with respect to FIG. 1A. For example, the peripheral die 440 may be a transceiver or a HBM.

Figure 4B:
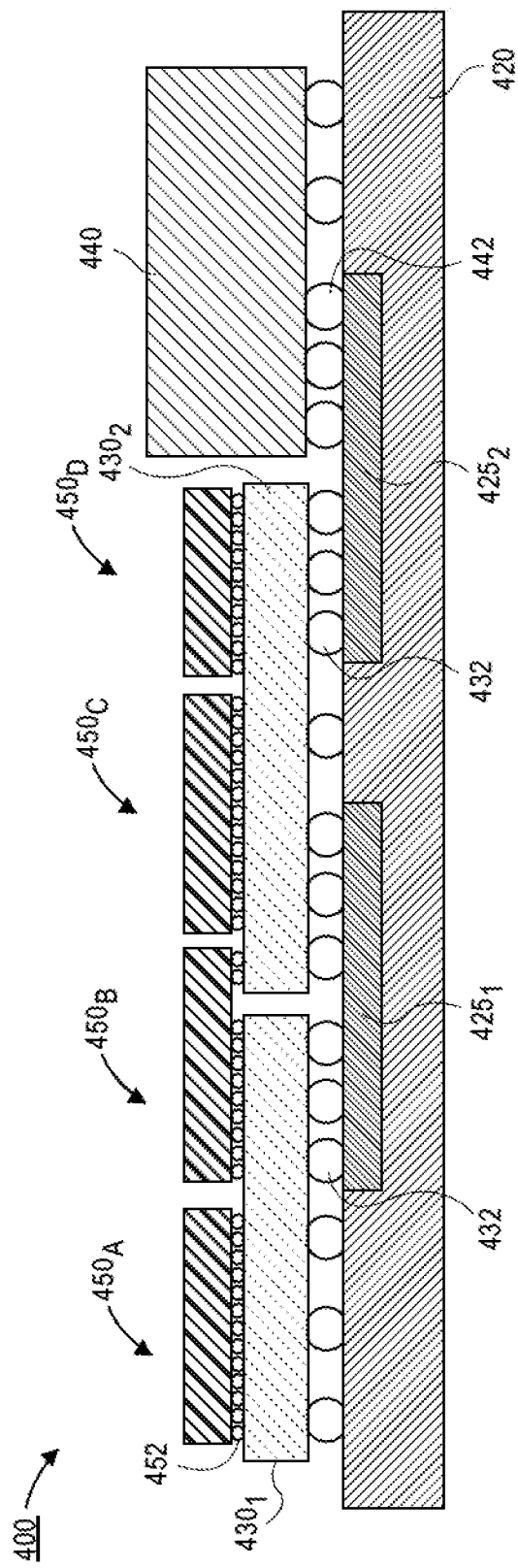
FIG. 4B is a cross-sectional illustration of an electronic package with a first interposer electrically coupled to a second interposer by a first EMIB and a die cube that is electrically coupled to the first interposer and the second interposer, in accordance with an embodiment.

Referring now to FIG. 4B, a cross-sectional illustration of an electronic package 400 is shown, in accordance with an embodiment. In an embodiment, the electronic package 400 may be substantially similar to the electronic package 400 described above with respect to FIG. 4A, with the exception that one or more of the die cubes 450 may span between two interposers 430. Particularly, in FIG. 4B die cube 450$_B$ includes interconnects 452 that are coupled to a first interposer 430$_1$ and a second interposer 430$_2$.

Figure 5:
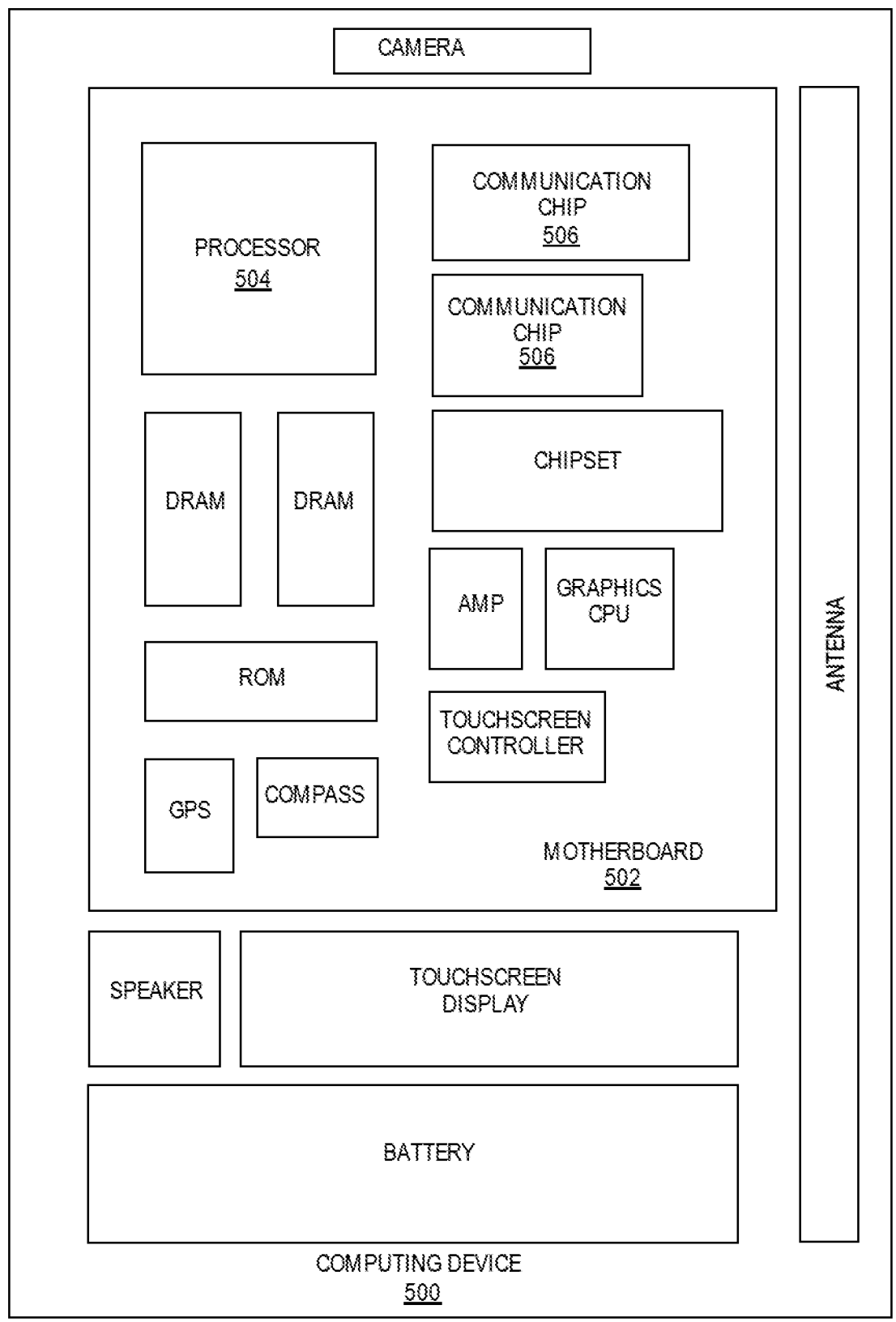
FIG. 5 is a schematic of a computing device built in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor may be packaged in an electronic package that comprises a die cube on an interposer and where the interposer is electrically coupled to a peripheral die with an EMIB, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip may be packaged in an electronic package that comprises a die cube on an interposer and where the interposer is electrically coupled to a peripheral die with an EMIB, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; an interposer on the package substrate; a first die cube and a second die cube on the interposer, wherein the interposer includes conductive traces for electrically coupling the first die cube to the second die cube; a die on the package substrate; and an embedded multi-die interconnect bridge (EMIB) in the package substrate, wherein the EMIB electrically couples the interposer to the die.

Example 2: the electronic package of Example 1, wherein the first die cube and the second die cube comprise field-programmable gate array (FPGA) dies.

Example 3: the electronic package of Example 1 or Example 2, wherein the first die cube and the second die cube each comprise an IC base die and a plurality of memory dies stacked over the IC base die.

Example 4: the electronic package of Examples 1-3, wherein the plurality of memory dies have a footprint that is larger than a footprint of the IC base die.

Example 5: the electronic package of Examples 1-4, further comprising: first interconnects coupling the first die cube and the second die cube to the interposer, wherein the first interconnects have a first pitch; second interconnects coupling the interposer to the EMIB and the die to the EMIB, wherein the second interconnects have a second pitch that is larger than the first pitch; and third interconnects coupling the interposer to the package substrate, wherein the third interconnects have a third pitch that is larger than the first pitch, wherein the first, second, and third interconnects comprise solder interconnects or copper-to-copper interconnects.

Example 6: the electronic package of Examples 1-5, wherein the interposer comprises silicon.

Example 7: the electronic package of Examples 1-6, wherein the interposer is a passive interposer.

Example 8: the electronic package of Examples 1-7, wherein the interposer is an active interposer.

Example 9: the electronic package of Examples 1-8, wherein the EMIB comprises silicon, ceramic, or organic materials.

Example 10: the electronic package of Examples 1-9, wherein the die is a transceiver, a high bandwidth memory (HBM), or any other stack of memory architectures.

Example 11: an electronic package, comprising: a package substrate; a first embedded multi-die interconnect bridge (EMIB) in the package substrate; a first interposer over the package substrate; a first plurality of die cubes on the first interposer; and a first die on the package substrate, wherein the first die is electrically coupled to the first interposer by the first EMIB.

Example 12: the electronic package of Example 11, wherein the first plurality of die cubes comprises a 2×2 array of die cubes.

Example 13: the electronic package of Example 11 or Example 12, wherein the first plurality of die cubes comprises an M×N array of die cubes, wherein M is 1 or more, and wherein N is 1 or more.

Example 14: the electronic package of Examples 11-13, wherein the first plurality of die cubes are electrically coupled to each other by conductive traces in the interposer.

Example 15: the electronic package of Examples 11-14, further comprising: a second interposer over the package substrate, wherein the second interposer is electrically coupled to the first interposer by a second EMIB in the package substrate.

Example 16: the electronic package of Examples 11-15, further comprising: a second plurality of die cubes on the second interposer.

Example 17: the electronic package of Examples 11-16, wherein at least one of the second plurality of die cubes is over the second interposer and the first interposer.

Example 18: the electronic package of Examples 11-17, further comprising: a second die on the package substrate, wherein the second die is electrically coupled to the first interposer by a second EMIB.

Example 19: the electronic package of Examples 11-18, wherein the first die is a high bandwidth memory, an in-package memory die, or a transceiver.

Example 20: the electronic package of Examples 11-19, wherein the die cubes in the first plurality of die cubes each comprise an IC base die and a plurality of stacked memory dies over the IC base die.

Example 21: the electronic package of Examples 11-20, wherein a footprint of the stacked memory dies is larger than a footprint of the IC base die.

Example 22: the electronic package of Examples 11-21, wherein the interposer is a passive silicon interposer.

Example 23: an electronic package comprising: a package substrate, the package substrate comprising a plurality of embedded multi-die interconnect bridges (EMIBs); a first interposer over the package substrate, the first interposer comprising silicon; a first plurality of die cubes on the first interposer, wherein each of the first plurality of die cubes comprises a field-programmable gate array (FPGA), and wherein the first plurality of die cubes are electrically coupled together by conductive traces in the first interposer, and wherein first interconnects electrically couple the first plurality of die cubes to the first interposer, wherein the first interconnects have a first pitch; and a first die on the package substrate, wherein the first die is electrically coupled to the first interposer by the one of the EMIBs in the plurality of EMIBs, wherein second interconnects electrically couple the first interposer to the EMIB and the first die to the EMIB, wherein the second interconnects have a second pitch that is larger than the first pitch.

Example 24: the electronic package of Example 23, wherein the FPGA comprises an advanced process node relative to the first die.

Example 25: the electronic package of Example 23 or Example 24, further comprising a plurality of memory dies stacked over each FPGA.

What is claimed is:

1. An electronic package, comprising:
a package substrate;
an interposer on the package substrate;
a first die cube and a second die cube on the interposer, wherein the interposer includes conductive traces for electrically coupling the first die cube to the second die cube;
a die on the package substrate; and
an embedded multi-die interconnect bridge (EMIB) in the package substrate, wherein the EMIB electrically couples the interposer to the die.

2. The electronic package of claim 1, wherein the first die cube and the second die cube comprise field-programmable gate array (FPGA) dies.

3. The electronic package of claim 1, wherein the first die cube and the second die cube each comprise an IC base die and a plurality of memory dies stacked over the IC base die.

4. The electronic package of claim 3, wherein the plurality of memory dies have a footprint that is larger than a footprint of the IC base die.

5. The electronic package of claim 1, further comprising:
first interconnects coupling the first die cube and the second die cube to the interposer, wherein the first interconnects have a first pitch;
second interconnects coupling the interposer to the EMIB and the die to the EMIB, wherein the second interconnects have a second pitch that is larger than the first pitch; and
third interconnects coupling the interposer to the package substrate, wherein the third interconnects have a third pitch that is larger than the first pitch, wherein the first, second, and third interconnects comprise solder interconnects or copper-to-copper interconnects.

6. The electronic package of claim 1, wherein the interposer comprises silicon.

7. The electronic package of claim 1, wherein the interposer is a passive interposer.

8. The electronic package of claim 1, wherein the interposer is an active interposer.

9. The electronic package of claim 1, wherein the EMIB comprises silicon, ceramic, or organic materials.

10. The electronic package of claim 1, wherein the die is a transceiver, a high bandwidth memory (HBM), or any other stack of memory architectures.

11. An electronic package, comprising:
a package substrate;
a first embedded multi-die interconnect bridge (EMIB) in the package substrate;
a first interposer over the package substrate;
a first plurality of die cubes on the first interposer; and
a first die on the package substrate, wherein the first die is electrically coupled to the first interposer by the first EMIB.

12. The electronic package of claim 11, wherein the first plurality of die cubes comprises a 2×2 array of die cubes.

13. The electronic package of claim 11, wherein the first plurality of die cubes comprises an M×N array of die cubes, wherein M is 1 or more, and wherein N is 1 or more.

14. The electronic package of claim 13, wherein the first plurality of die cubes are electrically coupled to each other by conductive traces in the interposer.

15. The electronic package of claim 11, further comprising:
- a second interposer over the package substrate, wherein the second interposer is electrically coupled to the first interposer by a second EMIB in the package substrate.

16. The electronic package of claim 15, further comprising:
- a second plurality of die cubes on the second interposer.

17. The electronic package of claim 16, wherein at least one of the second plurality of die cubes is over the second interposer and the first interposer.

18. The electronic package of claim 11, further comprising:
- a second die on the package substrate, wherein the second die is electrically coupled to the first interposer by a second EMIB.

19. The electronic package of claim 11, wherein the first die is a high bandwidth memory, an in-package memory die, or a transceiver.

20. The electronic package of claim 11, wherein the die cubes in the first plurality of die cubes each comprise an IC base die and a plurality of stacked memory dies over the IC base die.

21. The electronic package of claim 20, wherein a footprint of the stacked memory dies is larger than a footprint of the IC base die.

22. The electronic package of claim 11, wherein the interposer is a passive silicon interposer.

23. An electronic package comprising:
- a package substrate, the package substrate comprising a plurality of embedded multi-die interconnect bridges (EMIBs);
- a first interposer over the package substrate, the first interposer comprising silicon;
- a first plurality of die cubes on the first interposer, wherein each of the first plurality of die cubes comprises a field-programmable gate array (FPGA), and wherein the first plurality of die cubes are electrically coupled together by conductive traces in the first interposer, and wherein first interconnects electrically couple the first plurality of die cubes to the first interposer, wherein the first interconnects have a first pitch; and
- a first die on the package substrate, wherein the first die is electrically coupled to the first interposer by the one of the EMIBs in the plurality of EMIBs, wherein second interconnects electrically couple the first interposer to the one of the EMIBs and the first die to the one of the EMIBs, wherein the second interconnects have a second pitch that is larger than the first pitch.

24. The electronic package of claim 23, wherein the FPGA comprises an advanced process node relative to the first die.

25. The electronic package of claim 23, further comprising a plurality of memory dies stacked over each FPGA.

* * * * *